United States Patent [19]

Shieh et al.

[11] Patent Number: 5,530,715
[45] Date of Patent: Jun. 25, 1996

[54] VERTICAL CAVITY SURFACE EMITTING LASER HAVING CONTINUOUS GRADING

[75] Inventors: Chan-Long Shieh, Paradise Valley; Michael S. Lebby, Apache Junction, both of Ariz.; Hsing-Chung Lee, Calabasas, Calif.; Piotr Grodzinski, Chandler, Ariz.

[73] Assignee: Motorola, Inc., Schaumberg, Ill.

[21] Appl. No.: 346,559

[22] Filed: Nov. 29, 1994

[51] Int. Cl.[6] .................................................. H01S 3/08
[52] U.S. Cl. .............................................. 372/96; 372/45
[58] Field of Search .................................... 372/96, 43, 44, 372/45, 50

[56] References Cited

U.S. PATENT DOCUMENTS

| | | | |
|---|---|---|---|
| 5,115,441 | 5/1992 | Kopf et al. | 372/45 |
| 5,212,703 | 5/1993 | Kahen | 372/45 |
| 5,216,686 | 6/1993 | Holm et al. | 372/45 |
| 5,295,147 | 3/1994 | Jewell et al. | 372/45 |
| 5,301,201 | 4/1994 | Dutta et al. | 372/43 |
| 5,331,654 | 7/1994 | Jewell et al. | 372/45 |
| 5,351,256 | 9/1994 | Schneider et al. | 372/96 |
| 5,388,120 | 2/1995 | Ackley et al. | 372/95 |

*Primary Examiner*—Rodney B Bovernick
*Assistant Examiner*—Robert E. Wise
*Attorney, Agent, or Firm*—Gary F. Witting; Eugene A. Parsons

[57] ABSTRACT

A first stack of distributed Bragg mirrors having alternating layers of aluminum gallium arsenide differing in concentrations of an aluminum are disposed on a surface of a substrate with a first plurality of continuous gradient layers positioned between the alternating layers of differing aluminum concentrations to dynamically move the aluminum concentration from one of the alternating layer to another alternating layers. A first cladding region is disposed on the first stack of distributed Bragg mirrors. An active region is disposed on the first cladding region with a second cladding region being dispose on the active region. A second stack of distributed Bragg mirrors having alternating layers of aluminum gallium arsenide differing concentrations of aluminum are disposed on the second cladding region with a second plurality of continuous gradient layers being positioned between the alternating layers of differing aluminum concentrations to dynamically change the aluminum concentration from one of the altering layers to another alternating layers.

18 Claims, 2 Drawing Sheets

VERTICAL CAVITY SURFACE EMITTING LASER HAVING CONTINUOUS GRADING

FIELD OF THE INVENTION

This invention relates, in general, to optical devices and, more particularly, to vertical cavity surface emitting lasers.

BACKGROUND OF THE INVENTION

Conventional edge emitting semiconductor lasers are playing a significant role in development of optical communications due to their high operating efficiency, small size and modulation capabilities. However, with increasing performance and manufacturing needs, further reduction in size, these devices have severe limitations.

Recently, there has been an increased interest in a new type of laser device called a vertical cavity surface emitting laser (VCSEL). The VCSEL has a potential of several advantages, such as a smaller size, higher performance, and more manufacturable. However, to date, the VCSEL has not been able to fulfill these potential advantages due to a variety of problems, such as poor manufacturablity, high power consumption, high series resistance, and the like.

As can be seen, conventional structures of VCSEL devices do not meet requirements that are necessary for high volume manufacturing. Further, conventional VCSEL structures do not provide a low power consuming device. Thus conventional VCSEL structures are not suitable for low power applications. Therefore, a VCSEL structure that is highly manufacturable and provides a low power consuming VCSEL device would be highly desirable.

DETAILED DESCRIPTION OF THE DRAWINGS

Figure 1:
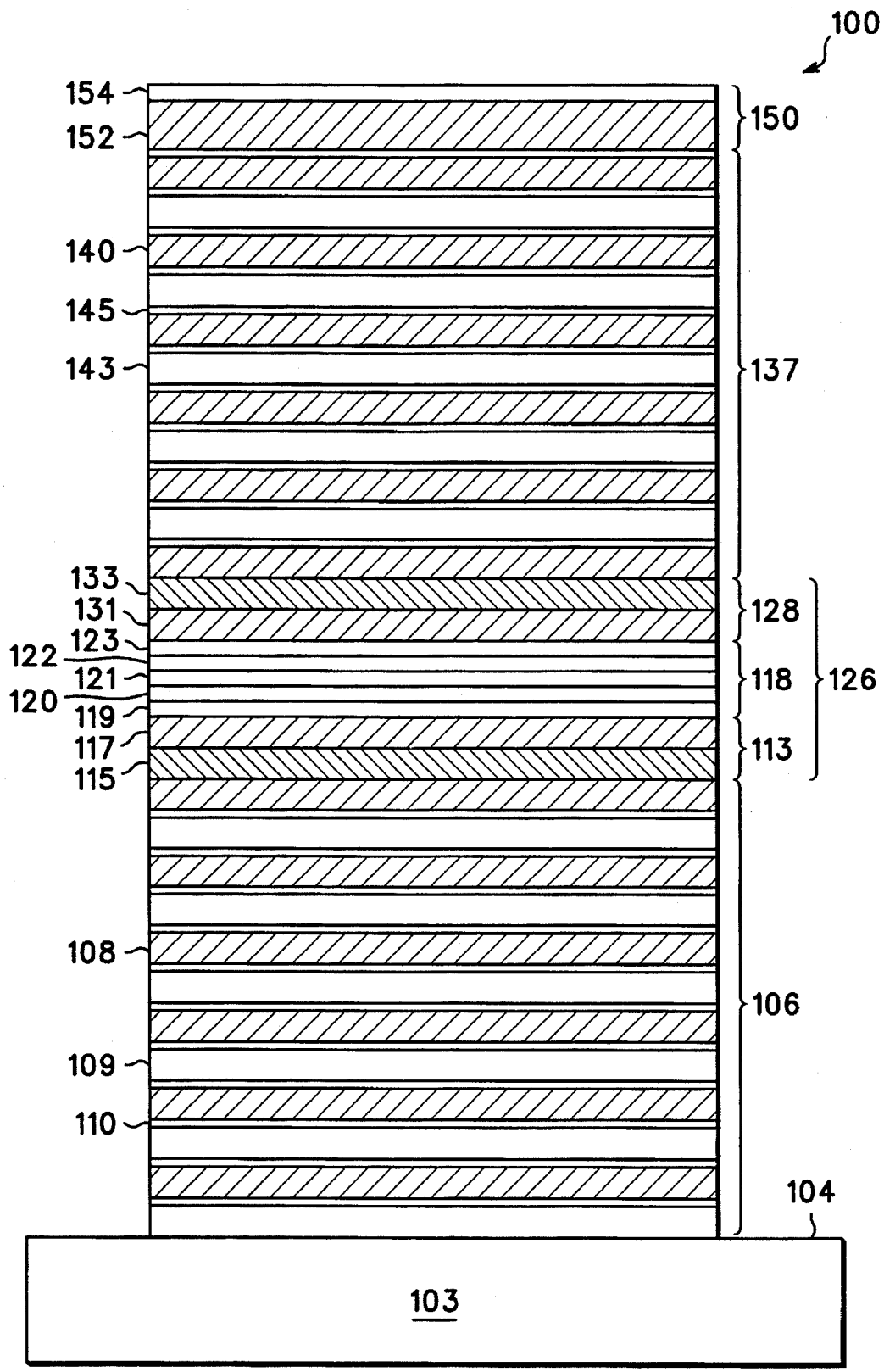
FIG. 1 illustrates an example of an enlarged simplified sectional view of a VCSEL device prepared on a semiconductor substrate.

Illustrated in FIG. 1 is an example of a simplified enlarged sectional view of a VCSEL 100. Generally, VCSEL 100 is made of several main elements, such as a substrate 103 having a surface 104, a stack of distributed Bragg reflectors 106, a cladding region 113 having layers 115 and 117, an active region 118 having barrier layers 120, 122 and quantum well layers 119, 121, and 123, a cladding region 128 having layers 131 and 133, a stack of distributed Bragg reflectors 137, and a contact region 150 having layers 152 and 154. The stacks of distributed Bragg reflectors 106 and 137 further include alternating layers or films 108, 109 and 140, 143, and continuous grating layers 110 and 145, respectively.

It should be understood that VCSEL 100 can be processed into a variety of configurations, such as a planar VCSEL device, a mesa-etched VCSEL, a ridge-waveguide VCSEL device, a buried heterostructure device, and the like. Further, while illustrating only a single VCSEL 100 as shown in FIG. 1, it should be understood that a plurality of VCSEL 100 devices can be formed so as to make arrays.

Additionally, to more particularly point out and clearly define applicants' present invention it will be assumed from hereinafter, that VCSEL 100 is designed to operate with a wavelength of 8,500 Angstroms having a range from 8,400 to 8,600 Angstroms. Thus, making specific values for concentrations, thicknesses, number of layers, and the like more relevant to VCSEL 100. However, it should be understood by one of ordinary skill in the art that VCSEL 100 can be designed to operate at any suitable wavelength, thereby changing concentrations, thicknesses, and number of layers.

Generally, substrate 103 is made of any suitable semiconductor material, such as gallium arsenide that is n-doped, p-doped, or semi-insulating; however, in this particular example, substrate 103 is made of gallium arsenide being n-doped. Gallium arsenide is used as substrate 103 to facilitate epitaxial growth of the stack of distributed Bragg reflectors 106 on surface 104 of substrate 103.

Deposition of the stacks of distributed Bragg reflectors 106 and 137, cladding regions 113 and 128, active region 118, and contact region 150 is achieved by any suitable method, such as Metal Organic Chemical Vapor Deposition (MOCVD), Molecular Beam Epitaxy (MBE), Chemical Beam Epitaxy (CBE), or the like. Use of these techniques or methods provide an epitaxial deposition of a variety of semiconductor materials, such as gallium arsenide, aluminum gallium arsenide, aluminum arsenide, indium gallium arsenide, and the like. However, in a preferred embodiment of the present invention, MOCVD is used to deposit or form the stacks of distributed Bragg reflectors 106 and 137, cladding region 113 and 128, active region 118, and contact region 150.

The stack of distributed Bragg reflectors 106 is disposed or deposited on surface 104 of substrate 103. The stack of distributed Bragg reflectors 106 includes several alternating films or layers, such as layers 108, 109, and continuous grading layer 110. Layers 108, 109, and continuous grading layer 110 are made of aluminum gallium arsenide doped with an n-type dopant. Any suitable n-type dopant, such as silicon (Si), selenium (Se), or the like is used for doping layers 108, 109, and continuous grading layer 110. However, in a preferred embodiment of the present invention, selenium is used for doping layers 108, 109, and continuous grading layer 110. Typically, doping concentrations of the n-type dopant for layers 108, 109 and continuous grading layer 110 that comprise the stack of distributed Bragg reflectors 106 can range from 5E17 to 5E18 per centimeter cubed (cm$^{-3}$) with a preferable range from 5E17 to 2E18, and with a nominal value of 1E18.

As can be seen in FIG. 1, positioning or disposing of layers 108, 109, and continuous grading layer 110 is accomplished so that continuous grading layers 110 are between layers 108 and 109, thereby separating layers 108 and 109.

Additionally, aluminum concentrations of the aluminum gallium arsenide that comprise layers 108 and 109 alternate between nominal values of 80 and 15 percent; however, aluminum concentrations in layers 108 and 109 can range from 75–100 and 0–20 percent, with a preferred range from 78–82 and 13–17 percent, respectively. With reference to continual grading layer 110, aluminum concentration of continual grading layer 110 varies as a gradient across layers 108 and 109, thereby gradually bridging the aluminum concentration from layers 108 to layers 109. Thus, by bridging layers 108 and 109 with continuous grading layer 110, a lower device series resistance and a lower current threshold are achieved; therefore, a VCSEL 100 that consumes less power is provided.

Generally, thickness of alternating layers 108 and 109 are set at one quarter wavelength (¼λ) of the desired wavelength at which VCSEL 100 is designed to operated at; however, it should be understood by one of ordinary skill in the art that normal process variations can vary specific thickness of layers 108, 109, and continuous grading layer 110, thereby varying the thickness slightly from their nominal values. Also, as shown in FIG. 1, a number of alternating layers, i.e., 108, 109, and continuous grading layer 110, are used to fabricate the stack of distributed Bragg reflectors 106. While the actual number of alternating layers changes from one specific application to another, an increase in the number of alternating layers improves performance of VCSEL 100. More specifically, referring to VCSEL 100 being designed to operate at 8,500 Angstroms, the stack of distributed Bragg reflector typically has 40 pair of layers 108 and 109 or a total of 80 layers.

Once the stack of distributed Bragg reflectors 106 has been disposed or deposited on substrate 103, a region 126 that approximates an optical thickness of approximately 1λ of the designed operating wavelength of VCSEL 100 is fabricated. Region 126 is made to include cladding region 113, active region 118, and cladding region 128.

Cladding region 113 having layers 115 and 117 is deposited or disposed on the stack of distributed Bragg reflectors 106 by any suitable epitaxial method or technique, wherein layer 115 is disposed on the stack of distributed Bragg reflectors 106, and wherein layer 117 is disposed on layer 115. Layers 115 and 117 are made of aluminum gallium arsenide with layer 115 being doped with an n-type dopant and layer 117 being undoped. Further, layer 115 is doped, with an n-type dopant, with similar doping ranges as previously described for the stack of distributed Bragg reflectors 106. Additionally, the aluminum concentration of the aluminum gallium arsenide for layer 115 can range from 40 to 60 percent, with preferred range from 45 to 55 percent, and a nominal value of 50 percent. Additionally, with VCSEL 100 designed to operated at 8,500 Angstroms with a range from 8,400 to 8,600 Angstroms, thickness of layer 115 is on the order of 400 Angstroms.

Layer 117 is made with any suitable aluminum concentration incorporated therein. Typically, the aluminum concentration of the aluminum gallium arsenide comprising layer 117 can range from 10–50 percent, with preferable range from 20–40 percent, with a nominal value of 30 percent. With VCSEL 100 designed to operate at 8,500 Angstroms, thickness of layer 115 is nominally on the order of 600 Angstroms.

Active region 118 is disposed on cladding region 113 by any suitable epitaxial method or technique. As shown in FIG. 1, active region 118 is made with quantum well layers 119, 121, and 123 and barrier layers 120 and 122. However, it should be understood by one of ordinary skill in the art that active region 118 can be simplified to a single quantum well layer 121 and barrier layers 120 and 122 Barrier layers 120 and 122 are made of undoped aluminum gallium arsenide having any suitable aluminum concentration incorporated therein. Typically, the aluminum concentration of barrier layers 120 and 122 range from 10 to 50 percent, with a preferable range from 20 to 40 percent, and with a nominal value of 30 percent.

Quantum well layers 119, 121, and 123 are made of undoped gallium arsenide layered with barrier layers 120 and 122 positioned between quantum well layers 119, 121, and 123, thereby forming alternating layers of quantum well layers and barrier layers 119, 120, 121, 122, and 123, respectively. Additionally, quantum well layers 119, 121, and 123 are sometimes made with an addition of another element to form a strained quantum well. Any suitable element can be added to the gallium arsenide, such as indium, or the like. Further, in accordance with VCSEL 100 being designed to operate at wavelength of 8,500 Angstroms with a range from 8,400 to 8,600, thickness of quantum well layers 119, 121, and 123 and barrier layers 120 and 122 are on the order of 100 Angstroms. Additionally, it should be appreciated that in some specific applications use of a strained quantum well can provide improved performance such as lower threshold currents, and the like Cladding region 128 having layers 131 and 133 is deposited or disposed on active region 118 by any suitable epitaxial method or technique, wherein layer 131 is disposed on active region 118, and wherein layer 133 is disposed on layer 131. Layer 131 is made of undoped aluminum gallium arsenide having any suitable aluminum concentration. Typically, the aluminum concentration of layer 131 can range from 10 to 50 percent, with a preferred range from 20 to 40 percent, and a nominal value of 30 percent.

Layer 133, the stack of distributed Bragg reflectors 137, i.e., layers 140 and 143, and continuous grading layer 145, and layer 152 of contact region 150 are made of aluminum gallium arsenide doped with any suitable p-type dopant, such as carbon, beryllium, zinc, or the like. However, in a preferred embodiment of the present invention, layer 133 and the distributed Bragg reflectors 137 are doped with carbon. Typically, carbon doping is achieved by using any suitable carbon source, such as an organometallic in gaseous or liquid form, such as carbon tetrachloride or carbon tetrabromide. Similarly, carbon doping can be achieved by intrinsic carbon doping utilizing arsenic source, such as tertiarybutylarsine (tBas), or trimethylarsenic (TMAs). Generally, the doping concentrations of the p-type dopant in the second stack of distributed Bragg reflectors 137 can range from 5E17 to 1E19, with a preferred range from 5E17 to 4E18, with a nominal value of 1E18. Further, in a preferred embodiment of the present invention, contact region 150 is doped with a p-type dopant such as zinc, or the like. Typically, doping concentrations of the p-type dopant, such as zinc can range from 1E18 to 5E19, with a nominal value of 2E19.

Additionally, layer 133 is made with any suitable aluminum concentration ranging from 40 to 60 percent, with a preferred range from 45 to 55 percent, and a nominal value of 50 percent.

The stack of distributed Bragg reflectors 137 is disposed or deposited on layer 133. The stack of distributed Bragg reflectors 137 includes several alternating films or layers 140 and 143, and continuous grading layer 145.

Aluminum concentrations of the aluminum gallium arsenide that comprise layers 140 and 143 alternate between nominal values of 80 and 15 percent; however, aluminum concentration in layer 140 and 143 can range form 75–100 and 0–20 percent, with a preferred range from 78–82 and 13–17 percent, respectively. With reference to continual grading layer 110, aluminum concentration of continual grading layer 145 varies as a gradient across layers 140 and 143, thereby gradually bridging the aluminum concentration from layers 140 to layers 143. Bridging layers 108 and 109 with continuous grading layer 110 that a lower current threshold is achieved; therefore, a VCSEL 100 that consumes less power is less resistive and therefore manufacturable.

As previously stated with reference to the stack of distributed Bragg reflectors 106, thickness of the stack of distributed Bragg reflectors 137, i.e., layers 140 and 143 are set at one quarter wavelength (¼λ) of the desired wavelength at which VCSEL 100 is designed to operate. However, it should be understood by one of ordinary skill in the art that some variations will be experienced, thereby varying the thicknesses of layers 140 and 143 from the ¼λ. As shown in FIG. 1, a number of alternating layers 140 and 143 are used to fabricate the stack of distributed Bragg reflectors 137. Generally, this number of alternating layers 140 and 143 is application specific, but typically an increased number of alternating layers 140 and 143 provide improved performance of VCSEL 100. Also, as shown in FIG. 1, a number of alternating layers, i.e., layers 140, 143, and continuous grading layer 145, are used to fabricate the second stack of distributed Bragg reflectors 137. While the actual numbers of alternating layers change from one specific application to another, generally, an increase in the alternating layers, i.e., layers 140, 143, and continuous grading layer 145 improves performance of VCSEL 100. More specifically, with VCSEL 100 being designed to operate at 8,500 Angstroms having a range form 8,400 to 8,600, the stack of distributed Bragg reflectors 137 typically has 30 pairs of layers 140 and 143 or a total of 60 layers.

As previously described, contact region 150 having layers 152 and 154 is deposited or disposed on the stack of distributed Bragg reflectors 137 by any suitable epitaxial method or technique, wherein layer 152 is deposed on the stack of distributed Bragg reflectors 137, and wherein layer 154 is disposed or deposited on layer 152.

Typically, layer 152 is made of aluminum gallium arsenide having an aluminum concentration on the order of 15 percent and having a thickness that ranges from 1,600 to 2,000 Angstrom with a nominal thickness of 1823 angstroms. However, it should be understood that the thickness of layer 152 changes with each specific application.

Layer 154 is made of gallium arsenide having a p-type dopant. Typically, layer 154 is made having a thickness that ranges from 50 to 300 Angstroms with a nominal thickness of 100 angstroms. However, it should be understood that the thickness of layer 154 changes with different specific applications.

Figure 2:
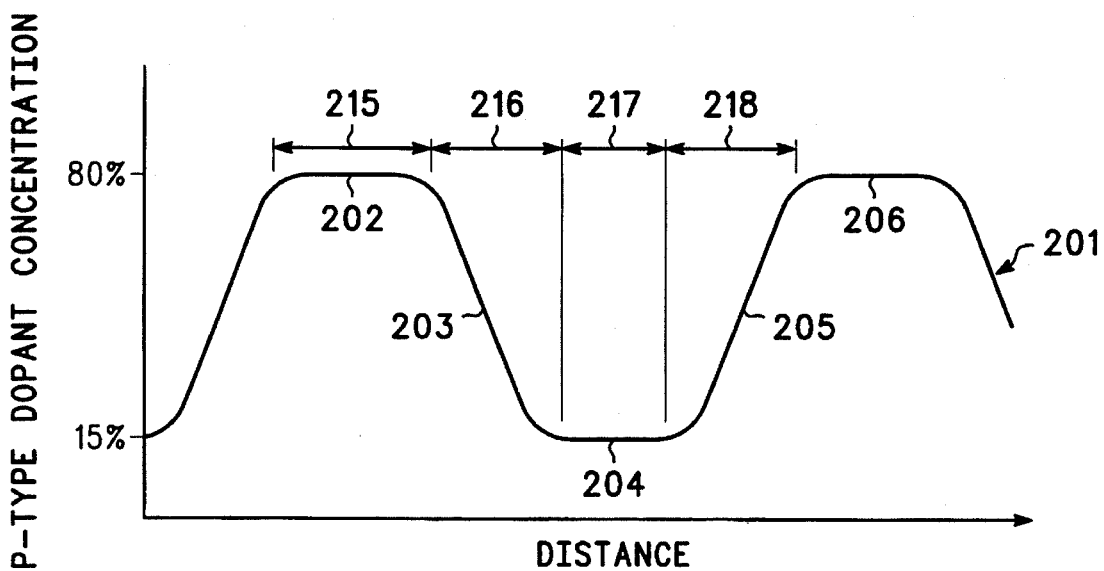
FIG. 2 is a graph illustrating relative aluminum concentration across a continuous grating layer.

Referring now to FIGS. 1 and 2, FIG. 2 is a graph illustrating aluminum concentrations versus distance, wherein the distance is a portion of VCSEL 100. The graph shows a curve 201 having portions 202, 203, 204, 205, and 206 and distances 215, 216, 217, and 218. By way of example, with distances 215, 216, and 217 being layer 108, continuous grading layer 110, and layer 109, respectively, curve 201 demonstrates changes of aluminum concentration of the aluminum gallium arsenide that makes layers 108, 109 and continuous grading layer 110. As can be seen in this example, portion 203 of curve 201 gradually connects: portion 202 with portion 204, thereby illustrating a gradual change in aluminum concentration from layer 108 to layer 109 in the aluminum gallium arsenide. Alternately, as also can be seen, portion 205 gradually connects portion 204 with portion 206, thereby illustrating a gradual change in aluminum concentration from layer 109 to 108 in the aluminum gallium arsenide. Also, portions 203 and 205 can have a curved, a linear, or a stepped format so that the aluminum concentration is gradually decreased or elevated. However, in a preferred embodiment of the present invention, the linear format is preferred.

Figure 3:
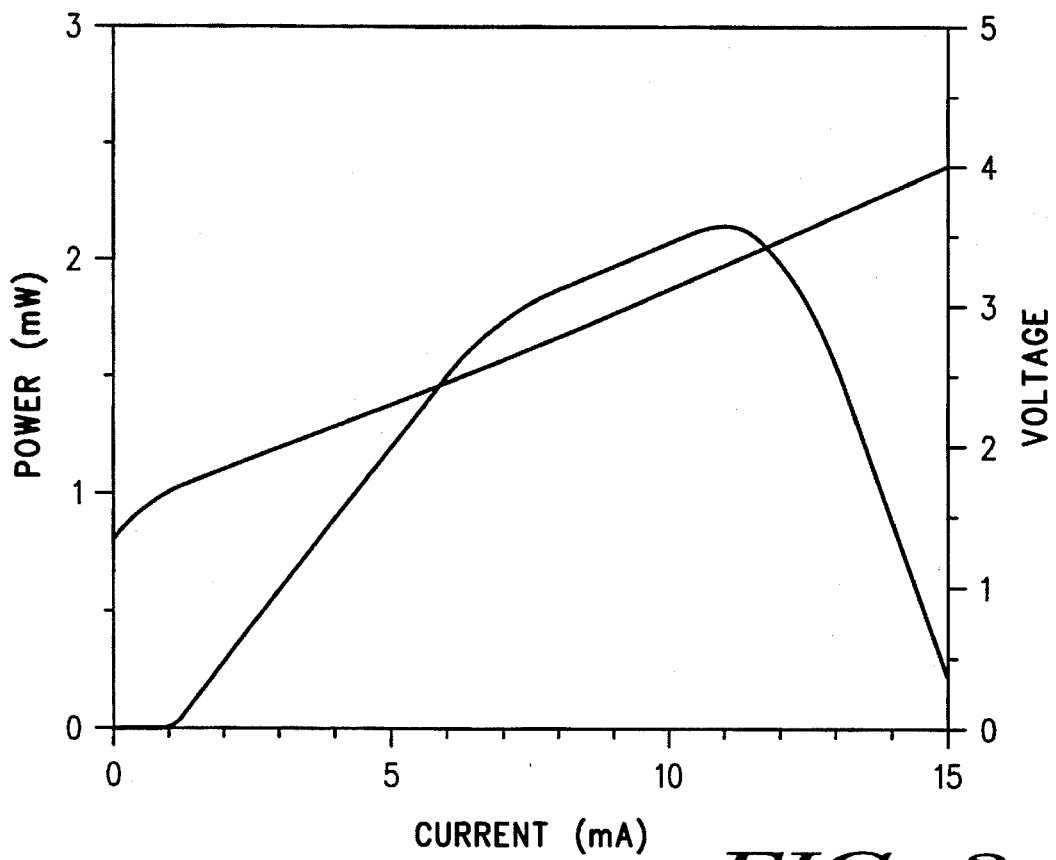
FIG. 3 is a graph illustrating some electrical characteristics of an embodiment of the present invention.

FIG. 3 is a graphical representation illustrating some performance values of VCSEL 100. Curve 301 describes an intensity of VCSEL 100 as a function of power in milliwatts and current in milliamperes. Curve 302 describes voltage and current in milliamperes of VCSEL 100. By calculating a slope of curve 302, a series resistance value is determined for VCSEL 100. In accordance with Ohm's Law, the following formula:

$$R = \frac{V_a - V_b}{I_a - I_b}$$

where $V_a$ is a voltage at point 304, where $V_b$ is a voltage at 306, where $I_a$ is a current at point 304, and where $I_b$ is a current at point 306 is used to calculate the series resistance R. Series resistance (R) for VCSEL 100 can range from 50 to 200 Ohms; however, typically, series resistance R) for VCSEL 100 is 100 Ohms. Thus, VCSEL 100 is a low resistance device with low resistance stacks of distributed Bragg reflectors.

By now it should be appreciated that a novel structure for a vertical cavity surface emitting laser, light emitting diodes, and the like has been provided. This structure provides a low resistance vertical cavity surface emitting laser device that enables the vertical cavity surface emitting device to be utilized in many more applications. Further, by having a low resistance device, vertical cavity surface emitting laser consumes less power. Additionally, this structure provides an easily manufacturable VCSEL.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser comprising:

a substrate having a surface;

a first stack of distributed Bragg reflectors having a first dopant with a first dopant concentration disposed on the surface of the substrate, the first stack of distributed Bragg reflectors include alternating layers of a first aluminum gallium arsenide layer having a first aluminum concentration and a second aluminum gallium arsenide layer having a second aluminum concentration with a continuous grading layer positioned between the first aluminum gallium arsenide layer and the second aluminum gallium arsenide layer, wherein the continuous grading layer provides an aluminum gradient between the alternating layers of the first aluminum gallium arsenide layer and the second aluminum gallium arsenide layer;

a first cladding region disposed on the first stack of distributed Bragg reflectors, the first cladding region including a third aluminum gallium arsenide layer having the first dopant with a second dopant concentration disposed on the first stack of distributed Bragg reflectors and a forth aluminum gallium arsenide layer deposited on the third aluminum gallium arsenide layer;

an active region disposed on the first cladding region, the active region including a strained layer between a first barrier layer and a second barrier layer, wherein the first barrier layer is disposed on the first cladding region, and wherein the second barrier layer is disposed on the strained layer;

a second cladding region disposed on the active region, the second cladding region including a fifth aluminum gallium arsenide layer having an second dopant with a third dopant concentration disposed on the second barrier layer and an sixth aluminum gallium arsenide layer deposited on the fifth aluminum gallium arsenide layer; and a second stack of distributed Bragg reflectors having a second dopant with a fourth dopant concentration disposed on the second cladding region, the second stack of distributed Bragg reflectors including alternating layers of a seventh aluminum gallium arsenide layer having a third aluminum concentration and a eighth aluminum gallium arsenide layer having a fourth aluminum concentration with a continuous grading layer position between the first aluminum gallium arsenide layer and the second aluminum gallium arsenide layer, wherein the continuous grading layer provides an aluminum gradient between the first aluminum gallium arsenide layer and the second aluminum gallium arsenide layer.

2. A vertical cavity surface emitting laser as claimed in claim 1 wherein the first dopant is n-type.

3. A vertical cavity surface emitting laser as claimed in claim 2 wherein the first dopant concentration ranges from 5E17 to 5E18.

4. A vertical cavity surface emitting laser as claimed in claim 1 wherein the first aluminum concentration ranges from 0 to 20 percent.

5. A vertical cavity surface emitting laser as claimed in claim 4 wherein the first aluminum concentration preferably ranges from 13 to 17 percent.

6. A vertical cavity surface emitting laser as claimed in claim 5 wherein the first aluminum concentration is on the order of 15 percent.

7. A vertical cavity surface emitting laser as claimed in claim 1 wherein the second aluminum concentration ranges from 75 to 100 percent.

8. A vertical cavity surface emitting laser as claimed in claim 7 wherein the second aluminum concentration preferably ranges from 78 to 82 percent.

9. A vertical cavity surface emitting laser as claimed in claim 8 wherein the second aluminum concentration is on the order of 80 percent.

10. A vertical cavity surface emitting laser as claimed in claim 1 wherein the second dopant is p-type.

11. A vertical cavity surface emitting laser as claimed in claim 10 wherein the p-type doping concentration is achieved by selecting one of the following p-type doping materials: carbon tetrachloride, carbon tetrabromide, or using intrinsic carbon doping with tBAs or trimethylarsenic (tMAs).

12. A vertical cavity surface emitting laser as claimed in claim 1 wherein the fourth dopant concentration ranges from 5E17 to 1E19.

13. A vertical cavity surface emitting laser as claimed in claim 12 wherein the fourth dopant concentration is on the order of 1E18.

14. A vertical cavity surface emitting laser as claimed in claim 1 wherein the substrate is gallium arsenide.

15. A vertical cavity surface emitting laser as claimed in claim 1 further including a contact layer, the contact layer including an aluminum gallium arsenide layer having a fifth aluminum concentration with the second dopant with a third dopant concentration and a gallium arsenide layer with a p-type dopant concentration.

16. A vertical cavity surface emitting laser as claimed in claim 15 wherein the fifth aluminum concentration ranges from 13 to 17 percent.

17. A vertical cavity surface emitting laser as claimed in claim 16 wherein the fifth aluminum concentration is on the order of 15 percent.

18. A vertical cavity surface emitting laser comprising:

a substrate having a surface:

a first stack of distributed Bragg mirrors having alternating layers of differing concentrations of an aluminum disposed on the surface of the substrate;

first continuous gradient layers positioned between the alternating layers of differing aluminum concentrations to dynamically move the aluminum concentration from one of the alternating layers to another of the alternating layers;

a first cladding region disposed on the first stack of distributed Bragg mirrors;

an active region disposed on the first cladding region;

a second cladding region dispose on the active region;

a second stack of distributed Bragg mirrors having alternating layer of differing concentrations of aluminum disposed on the second cladding region; and second continuous gradient layers positioned between the alternating layer of differing aluminum concentrations to dynamically move the aluminum concentration from one of the altering layers to another of the alternating layers.

* * * * *